(12) United States Patent
Smith et al.

(10) Patent No.: US 6,542,282 B2
(45) Date of Patent: Apr. 1, 2003

(54) POST METAL ETCH CLEAN PROCESS USING SOFT MASK

(75) Inventors: David M. Smith, Plano, TX (US); Eric R. Trumbauer, Frisco, TX (US); Ronald C. Roth, McKinney, TX (US); Brian P. Scott, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/036,697

(22) Filed: Dec. 31, 2001

(65) Prior Publication Data

US 2002/0126368 A1 Sep. 12, 2002

Related U.S. Application Data

(60) Provisional application No. 60/258,918, filed on Dec. 29, 2000.

(51) Int. Cl.[7] ............... G02B 26/00; H01L 27/302; H01L 27/461; G03C 3/00
(52) U.S. Cl. ............... 359/291; 438/707; 430/11
(58) Field of Search ............... 359/290, 291, 359/298; 438/702, 689, 707; 430/273.1, 9, 11, 311, 312, 320, 322, 16

(56) References Cited

U.S. PATENT DOCUMENTS

| | | |
|---|---|---|
| 5,061,049 A | 10/1991 | Hornbeck |
| 5,583,688 A | 12/1996 | Hornbeck |
| 5,658,698 A * | 8/1997 | Yagi et al. ............... 430/11 |
| 6,040,611 A * | 3/2000 | De Los Santos et al. ... 257/415 |
| 6,455,227 B1 * | 9/2002 | Hara ............... 430/273.1 |

* cited by examiner

*Primary Examiner*—Georgia Epps
*Assistant Examiner*—William Choi
(74) *Attorney, Agent, or Firm*—Charles A. Brill; Wade James Brady, III; Frederick J. Telecky, Jr.

(57) ABSTRACT

A method of patterning a metal layer that cleans the residue from a metal etch process without removing a photoresist etch mask. The method is particularly useful for the fabrication of micromirror devices, or other MEMS devices that use photoresist spacer layers. A photoresist layer is spun on to the mirror metal layer in step 906. The photoresist is patterned and developed in step 908 to form openings to the metal layer. The openings define areas where the mirror metal layer will be removed. The patterned photoresist is inspected in step 910. The mirror metal layer is etched in step 912 using the patterned photoresist layer as an etch mask. After the mirror metal has been etched, the webbing and other residues are removed in a clean up process 914 that uses photoresist developer as a solvent to remove the webbing. After the developer clean up process, the mirrors are inspected in step 916 to verify the proper gaps have been etched between the mirrors and the removal of the mirror etch residue. A photoresist saw prep coating is then spun onto the wafer in step 918, the wafers are sawn in step 920 and scrubbed in step 922 before the mirrors are undercut in step 924. The undercut process removes the photoresist spacer layers on which the hinge yoke and mirror have been fabricated, allowing mirrors to rotate about the torsion hinges.

35 Claims, 6 Drawing Sheets

POST METAL ETCH CLEAN PROCESS USING SOFT MASK

CROSS-REFERENCE TO RELATED APPLICATIONS

This application claims priority under 35 USC §119(e)(1) of provisional application No. 60/258,918 filed Dec. 29, 2000.

The following patents and/or commonly assigned patent applications are hereby incorporated herein by reference:

| Patent No. | Filing Date | Issue Date | Title |
| --- | --- | --- | --- |
| 5,061,049 | Sept. 13, 1990 | Oct. 29, 1991 | Spatial Light Modulator and Method |
| 5,583,688 | Dec. 21, 1993 | Dec. 10, 1996 | Multi-Level Digital Micromirror Device |

FIELD OF THE INVENTION

This invention relates to the field of micro-electro-mechanical device fabrication, more particularly to the fabrication of micromirror devices.

BACKGROUND OF THE INVENTION

Micromechanical devices are small structures typically fabricated on a semiconductor wafer using techniques such as optical lithography, doping, metal sputtering, oxide deposition, and plasma etching that have been developed for the fabrication of integrated circuits.

Micromirror devices are a type of micro-electro-mechanical systems (MEMS). Other types of MEMS devices include accelerometers, pressure and flow sensors, gears and motors. While some micromechanical devices, such as pressure sensors, flow sensors, and micromirrors have found commercial success, other types have not yet been commercially viable.

Micromirror devices primarily are used in optical display systems. In display systems, the micromirror is a light modulator that uses digital image data to modulate a beam of light by selectively reflecting portions of the beam of light to a display screen. While analog modes of operation are possible, micromirrors typically operate in a digital bistable mode of operation and as such are the core of the first true digital full-color image projection systems.

Micromirrors have evolved rapidly over the past ten to fifteen years. Early devices used a deformable reflective membrane which, when electrostatically attracted to an underlying address electrode, dimpled toward the address electrode. Schlieren optics illuminate the membrane and create an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Torsion beam devices use a thin metal layer to form a torsion beam, which is referred to as a hinge, and a thicker metal layer to form a rigid member, or beam, typically having a mirror-like surface: concentrating the deformation on a relatively small portion of the micromirror surface. The rigid mirror remains flat while the hinges deform, minimizing the amount of light scattered by the device and improving the contrast ratio of the device.

Recent micromirror configurations, called hidden-hinge designs, further improve the image contrast ratio by fabricating the mirror on a pedestal above the torsion beams. The elevated mirror covers the torsion beams, torsion beam supports, and a rigid yoke connecting the torsion beams and mirror support, further improving the contrast ratio of images produced by the device.

Throughout the development of micromirror devices, as with the development of semiconductors, great strides have been made to improve the fabrication yield of the manufacturing process. Blocked etch at the mirror level is one of the major causes of loss during the micromirror fabrication process. A new process is needed to help prevent blocked mirror etch without introducing other problems in the micromirror fabrication flow.

SUMMARY OF THE INVENTION

Objects and advantages will be obvious, and will in part appear hereinafter and will be accomplished by the present invention which provides a method for patterning a metal layer and a cleanup process that removes metal etch residues but does not harm remaining photoresist. One embodiment of the disclosed invention provides a method of fabricating a semiconductor device. The method comprises: depositing a first photoresist layer on a wafer of partially formed devices, depositing a metal layer over the first photoresist layer, depositing a second photoresist layer over the metal layer, patterning the second photoresist layer to expose regions of the metal layer, etching the metal layer to remove the exposed regions of the metal layer, and cleaning residue created by the etching using a photoresist developer. The cleaning does not harm the first and second photoresist layers which remain after the cleaning.

Another embodiment of the disclosed invention provides a method of patterning a metal layer. The method comprises: depositing a metal layer on a wafer of partially formed devices, depositing a photoresist layer over the metal layer, patterning the photoresist layer to expose regions of the metal layer, etching the metal layer to remove the exposed regions of the metal layer, and cleaning residue created by the etching using a photoresist developer. The cleaning process does not remove the patterned photoresist layer.

According to one embodiment of the disclosed invention, the patterning of the photoresist layer defines mirrors in the metal layer. According to another embodiment of the disclosed invention, the patterning of the photoresist layer defines electrical interconnections in the metal layer.

According to an alternate embodiment of the disclosed invention, which is not used in the manufacture of micromirror devices but may be useful to manufacture isolated or insulated interconnections in other semiconductor devices, the remaining photoresist is reflowed, typically by heating the remaining photoresist. Another metal layer may be deposited on the reflowed photoresist layer and patterned. Additional layers of reflowed photoresist and patterned metal may be fabricated. The reflowed photoresist layers may be removed, leaving an insulating air gap between the patterned metal layers. This air gap may later be filled with an insulator.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
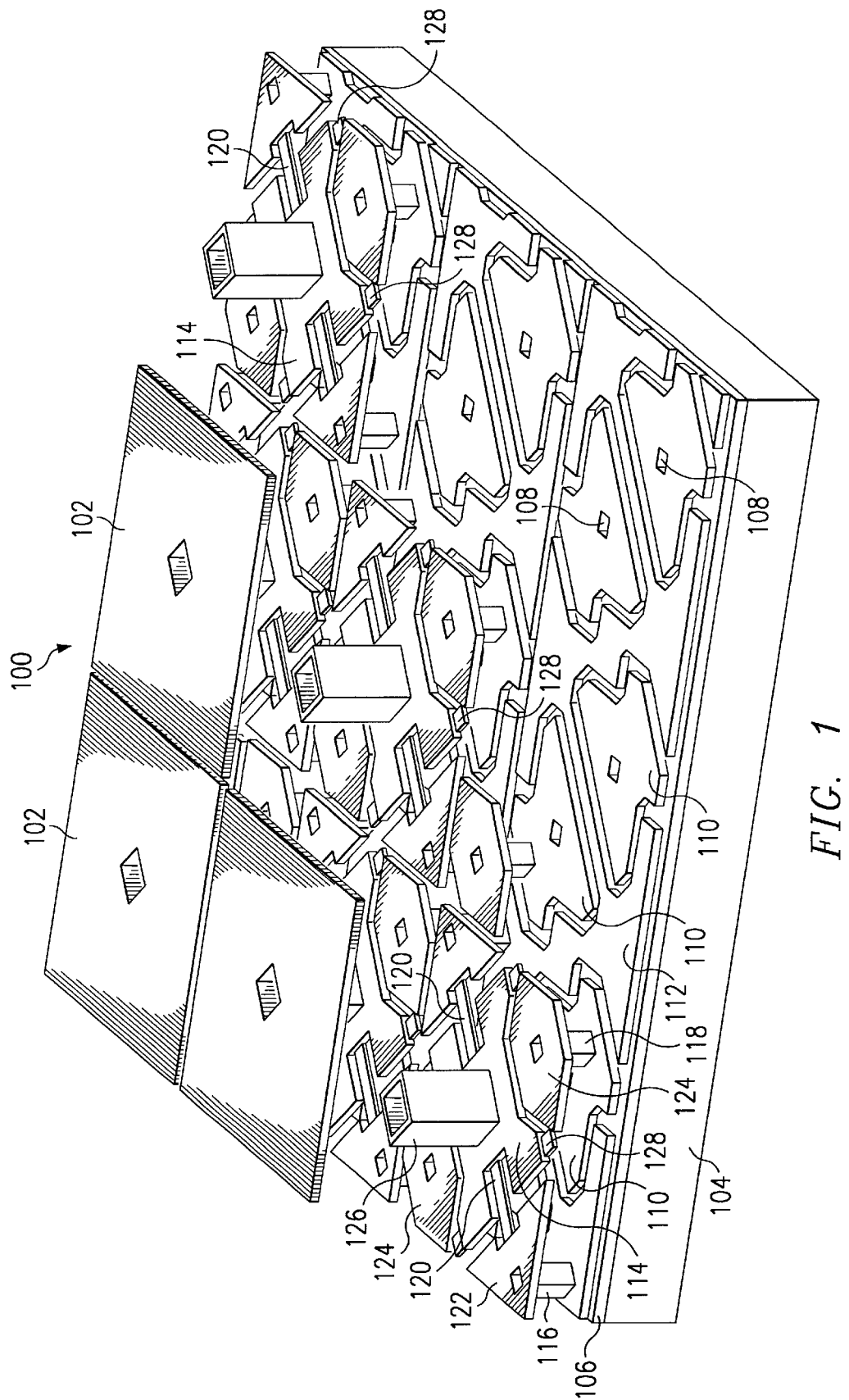
FIG. 1 is a perspective view of a small portion of a micromirror array fabricated using the processes of the present invention.
Figure 2:
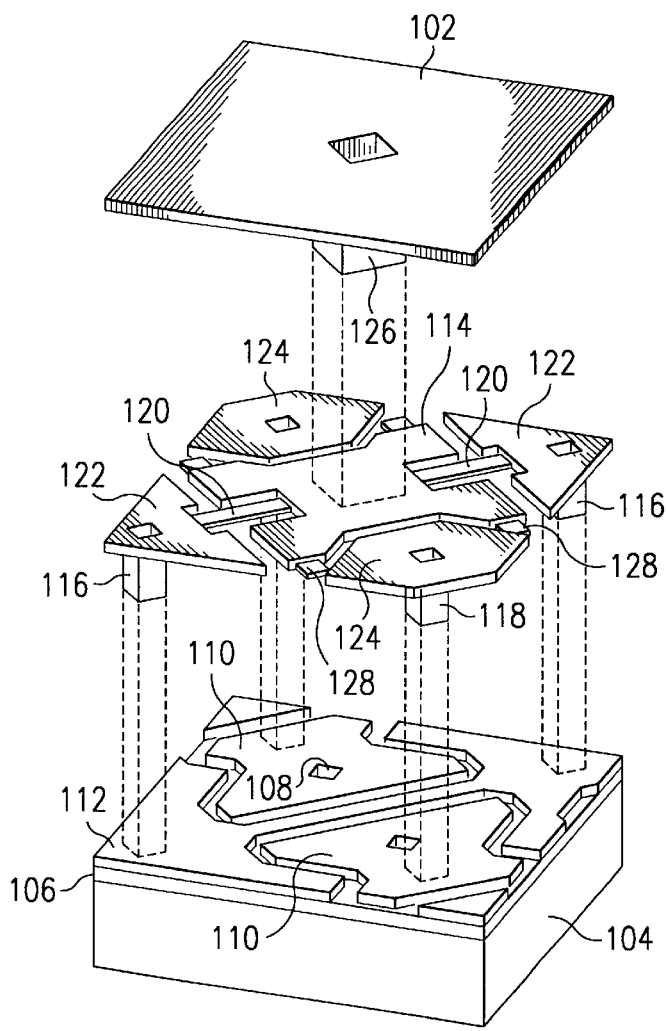
FIG. 2 is an exploded perspective view of a single micromirror element from the micromirror array of FIG. 1.

A typical hidden-hinge micromirror 100 is actually an orthogonal array of micromirror cells, or elements. This array often includes more than a thousand rows and columns of micromirrors. FIG. 1 shows a small portion of a micromirror array of the prior art with several mirrors 102 removed to show the underlying mechanical structure of the micromirror array. FIG. 2 is an exploded view of a single micromirror element of the prior art further detailing the relationships between the micromirror structures.

A micromirror is fabricated on a semiconductor, typically silicon, substrate 104. Electrical control circuitry is typically fabricated in or on the surface of the semiconductor substrate 104 using standard integrated circuit process flows. This circuitry typically includes, but is not limited to, a memory cell associated with, and typically underlying, each mirror 102 and digital logic circuits to control the transfer of the digital image data to the underlying memory cells. Voltage driver circuits to drive bias and reset signals to the mirror superstructure may also be fabricated on the micromirror substrate, or may be external to the micromirror. Image processing and formatting logic is also formed in the substrate 104 of some designs. For the purposes of this disclosure, addressing circuitry is considered to include any circuitry, including direct voltage connections and shared memory cells, used to control the direction of rotation of a micromirror.

Some micromirror configurations use a split reset configuration which allows several micromirror elements to share one memory cell—thus reducing the number of memory cells necessary to operate a very large array, and making more room available for voltage driver and image processing circuitry on the micromirror integrated circuit. Split reset is enabled by the bistable operation of a micromirror, which allows the contents of the underlying memory to change without affecting the position of the mirror 102 when the mirror has a bias voltage applied.

The silicon substrate 104 and any necessary metal interconnection layers are isolated from the micromirror superstructure by an insulating layer 106 is typically a silicon dioxide layer on which the micromirror superstructure is formed. Holes, or vias, are opened in the oxide layer to allow electrical connection of the micromirror superstructure with the electronic circuitry formed in the substrate 104.

The first layer of the superstructure is a metalization layer, typically the third metalization layer and therefore often called M3. The first two metalization layers are typically required to interconnect the circuitry fabricated on the substrate. The third metalization layer is deposited on the insulating layer and patterned to form address electrodes 110 and a mirror bias connection 112. Some micromirror designs have landing electrodes which are separate and distinct structures but are electrically connected to the mirror bias connection 112. Landing electrodes limit the rotation of the mirror 102 and prevent the rotated mirror 102 or hinge yoke 114 from touching the address electrodes 110, which have a voltage potential relative to the mirror 102. If the mirror 102 contacts the address electrodes 110, the resulting short circuit could fuse the torsion hinges 116 or weld the mirror 102 to the address electrodes 110, in either case ruining the micromirror.

Since the same voltage is always applied both to the landing electrodes and the mirrors 102, the mirror bias connection and the landing electrodes are preferably combined in a single structure when possible. The landing electrodes are combined with the mirror bias connection 112 by including regions on the mirror bias/reset connection 112, called landing sites, which mechanically limit the rotation of the mirror 102 by contacting either the mirror 102 or the torsion hinge yoke 114. These landing sites are often coated with a material chosen to reduce the tendency of the mirror 102 torsion hinge yoke 114 to stick to the landing site.

Mirror bias/reset voltages travel to each mirror 102 through a combination of paths using both the mirror bias/reset metalization 112 the mirrors and torsion beams of adjacent mirror elements. Split reset designs require the array of mirrors to be subdivided into multiple subarrays each having an independent mirror bias connection. The landing electrode/mirror bias 112 configuration shown in FIG. 1 is ideally suited to. split reset applications since the micromirror elements are easily segregated into electrically isolated rows or columns simply by isolating the mirror bias/reset layer between the subarrays. The mirror bias/reset layer of FIG. 1 is shown divided into rows of isolated elements.

A first layer of supports, typically called spacervias, is fabricated on the metal layer forming the address electrodes 110 and mirror bias connections 112. These spacervias, which include both hinge support spacervias 116 and upper address electrode spacervias 118, are typically formed by spinning a thin spacer layer over the address electrodes 110 and mirror bias connections 112. This thin spacer layer is typically a 1 µm thick layer of positive photoresist. After the photoresist layer is deposited, it is exposed, patterned, and deep UV hardened to form holes in which the spacervias will be formed. This spacer layer and a thicker spacer layer used later in the fabrication process are often called sacrificial layers since they are used only as forms during the fabrication process and are removed from the device prior to device operation.

A thin layer of metal is sputtered onto the spacer layer and into the holes. An oxide is then deposited over the thin metal layer and patterned to form an etch mask over the regions that later will form hinges 120. A thicker layer of metal, typically an aluminum alloy, is sputtered over the thin layer and oxide etch masks. Another layer of oxide is deposited and patterned to define the hinge yoke 114, hinge cap 122, and the upper address electrodes 124. After this second oxide layer is patterned, the two metals layers are etched simultaneously and the oxide etch stops are removed to leave thick rigid hinge yokes 114, hinge caps 122, and upper address electrodes 124, and thin flexible torsion beams 120.

A thick spacer layer is then deposited over the thick metal layer and patterned to define holes in which mirror support spacervias 126 will be formed. The thick spacer layer is typically a 2 µm thick layer of positive photoresist. A layer of mirror metal, typically an aluminum alloy, is sputtered on the surface of the thick spacer layer and into the holes in the thick spacer layer. This metal layer will be patterned to form the mirrors 102. Where the metal is sputtered into the holes in the thick spacer layer it forms the mirror support spacervias 126.

Figure 4:
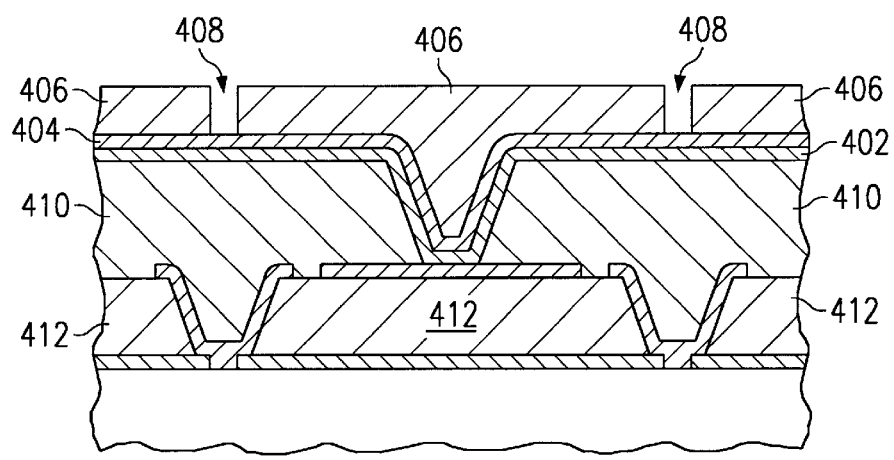
FIG. 4 is a cross section side view of a portion of a micromirror array prior to patterning an oxide mirror mask according to a fabrication process of the prior art.
Figure 3:
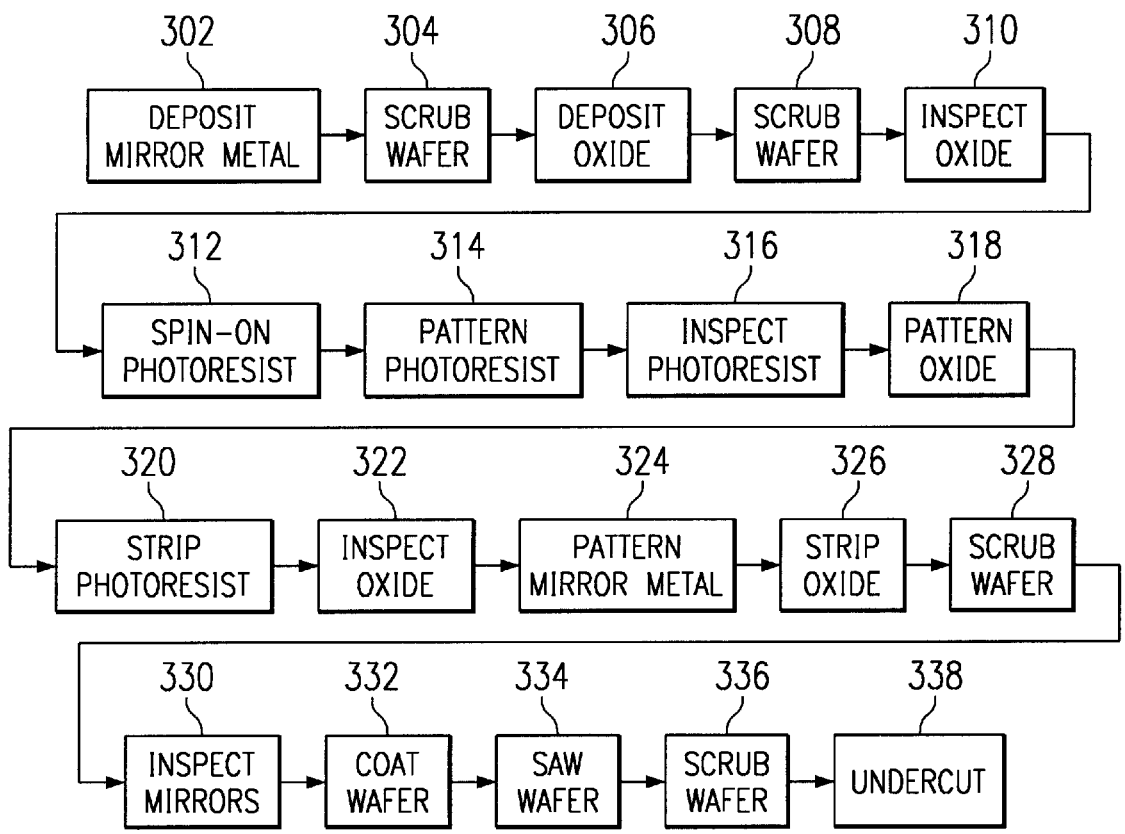
FIG. 3 is a block diagram of the fabrication process according to the prior art.

The traditional process flow is illustrated in FIGS. 3 through 8. FIG. 3 is a block diagram showing the processing steps, and FIGS. 4 through 8 are cross section views of various stages of the mirror fabrication process. The mirror metal is sputter deposited in step 302 of FIG. 3. The wafer is then scrubbed with water in step 304. After cleaning the wafer, a thick oxide layer is deposited over the mirror metal layer in step 306. The metal layer 302 and oxide layer 404 are shown in FIG. 4.

Returning to FIG. 3, the oxide layer is scrubbed with water in step 308 and the surface is inspected for defects in step 310. A photoresist layer is then spun on to the oxide layer in step 312. The photoresist is patterned and developed in step 314 to form openings to the oxide layer. The openings define areas where the mirror metal layer will be removed. The patterned photoresist is inspected in step 316 before etching the exposed oxide in step 318.

Figure 5:
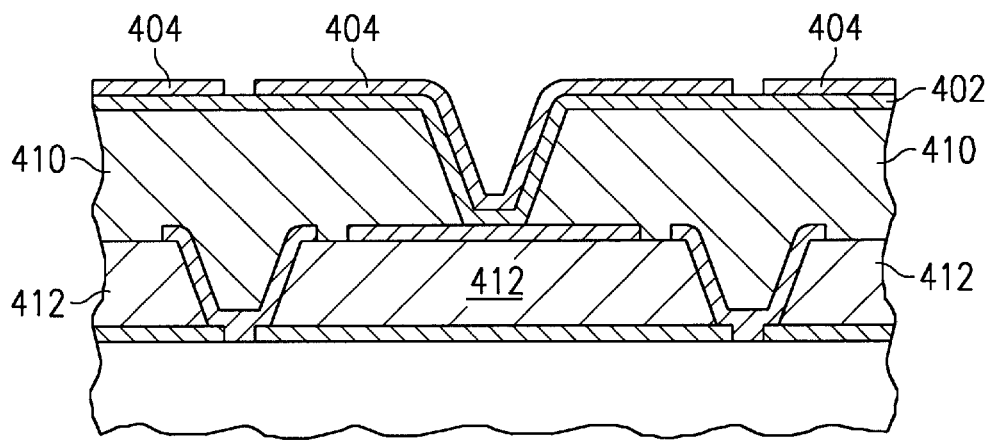
FIG. 5 is a cross section side view of the portion of a micromirror array of FIG. 4 after patterning the oxide mirror mask according to a fabrication process of the prior art.
Figure 6:
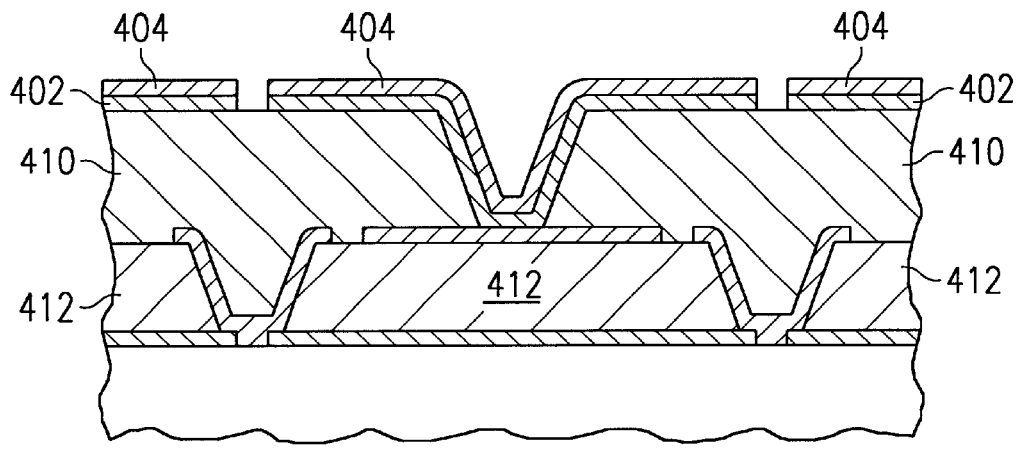
FIG. 6 is a cross section side view of the portion of a micromirror array of FIG. 4 after etching mirror metal layer according to a fabrication process of the prior art.
Figure 7:
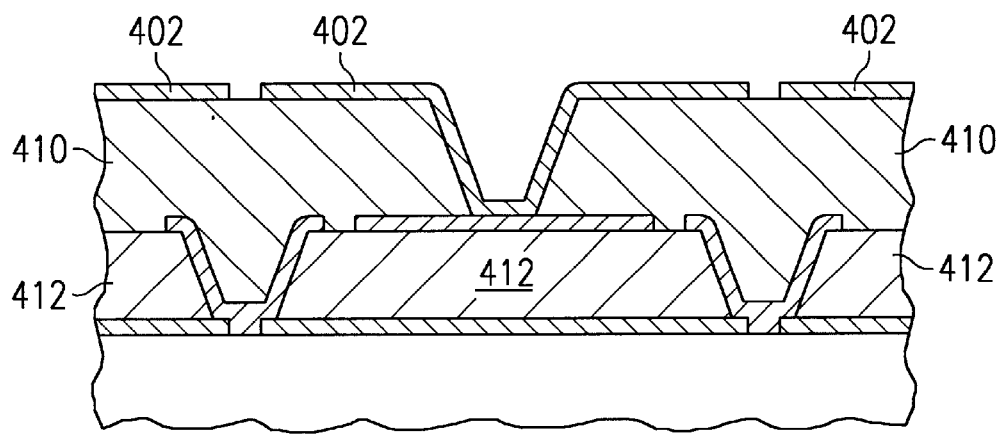
FIG. 7 is a cross section side view of the portion of a micromirror array of FIG. 4 after stripping the oxide mirror mask according to a fabrication process of the prior art.

After patterning the oxide layer, the photoresist layer is removed in step 320 and the patterned oxide layer is inspected in step 322. FIG. 5 shows a portion of the wafer at this point in the fabrication process. The oxide layer forms a mask, protecting the underlying mirror metal when the remainder of the mirror metal layer is etched away in step 324 of FIG. 3. FIG. 6 shows a portion of the wafer at this point in the fabrication process. The mirror oxide is then stripped using a series of ashing and solvent cleanup steps shown as step 326 of FIG. 3. The process used to remove the oxide mirror masks should not attack the photoresist beneath the mirrors. If the photoresist beneath the mirrors is removed, the mirrors may tip and could be damaged by latter processing steps. FIG. 7 shows the portion of the micromirror array after the oxide mirror mask has been stripped.

After stripping the oxide mirror mask the wafer is once again scrubbed using water in step 328. The mirrors are inspected in step 330. The inspection of step 330 measures the critical dimensions of the mirror level—the mirror size and gaps between the mirrors—and also inspects the mirror gaps to ensure the etch has been completed. After the inspection, the wafers are coated with a saw prep photoresist in step 332. The saw prep photoresist protects the mirrors from debris created during the saw process. Without the saw prep coating, the debris could easily scratch the mirrors.

Figure 8:
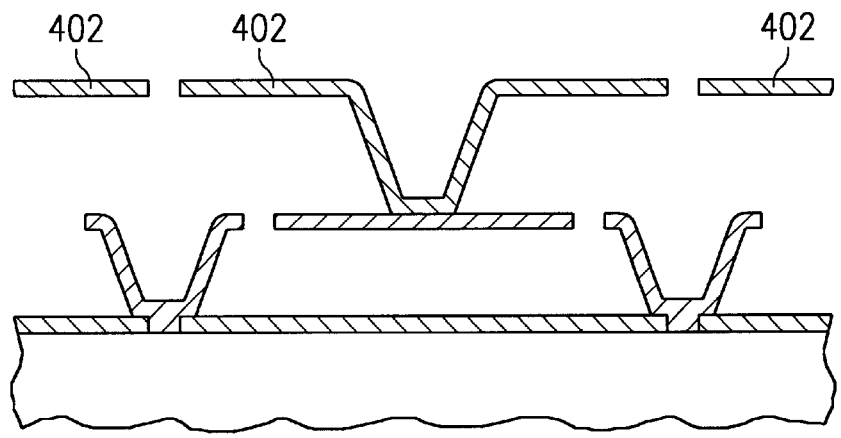
FIG. 8 is a cross section side view of the portion of a micromirror array of FIG. 4 after undercutting the mirrors according to a fabrication process of the prior art.

After sawing the wafer of partially completed micromirror device in step 334, the diced wafer is scrubbed in step 336 before the mirrors are undercut. The undercut process of step 338 removes the photoresist spacer layers on which the hinge yoke and mirror have been fabricated. After the first and second photoresist spacer layers are removed, the mirrors are able to rotate about the torsion hinges. FIG. 8 shows a portion of the completed micromirror device.

A new process has been developed that provides a significant increase in yield. The primary yield improvement is due to reducing the failures caused by blocked etch at the mirror metal layer. The blocked etch primarily is the result of two different mechanisms. First, blocked oxide mask defects led to blocked mirror metal etch defects. Second, a chemical reaction resulting from a residue of the oxide patterning step formed a micro-mask on the mirror metal preventing it from properly etching. The fluorine chemistry of the oxide patterning step left fluorine on the mirror metal surface. This fluorine reacted with the AlSiTi mirror metal to form an Al—F compound capable of blocking the mirror metal etch.

Another problem with the prior art practice was the accumulation of a polymer residue created during the mirror metal etch process. This residue, or webbing, was difficult to remove and could lead to device failures. The clean up process provided by this fabrication process removes all or nearly all of the webbing created during the etch process.

Figure 9:
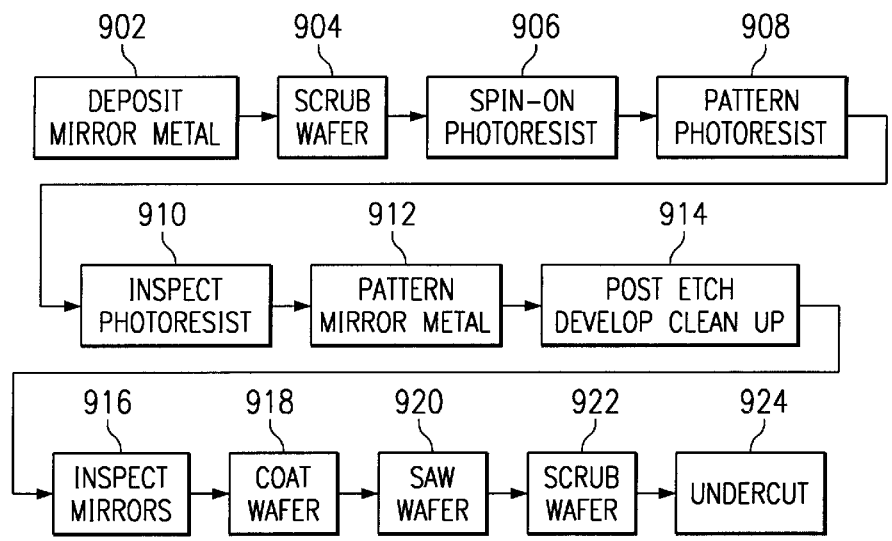
FIG. 9 is a block diagram of the fabrication process according to one embodiment of the present invention.
Figure 10:
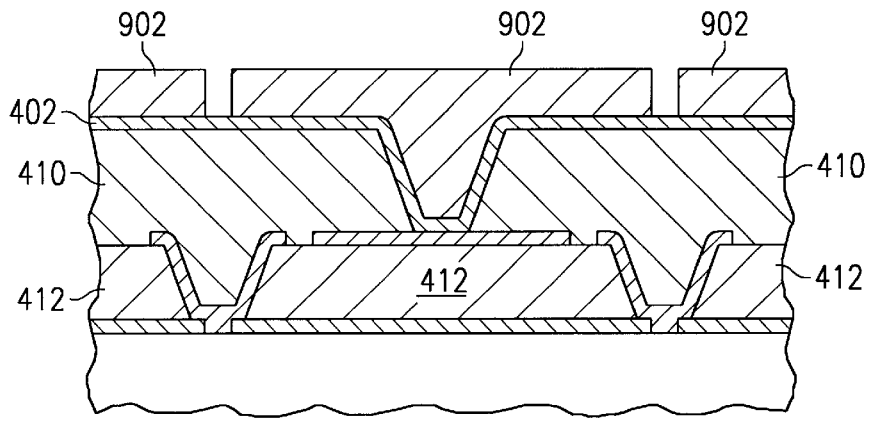
FIG. 10 is a cross section side view of a portion of a micromirror array prior showing a patterned photoresist layer on a mirror metal layer according to one embodiment of the present invention.
Figure 11:
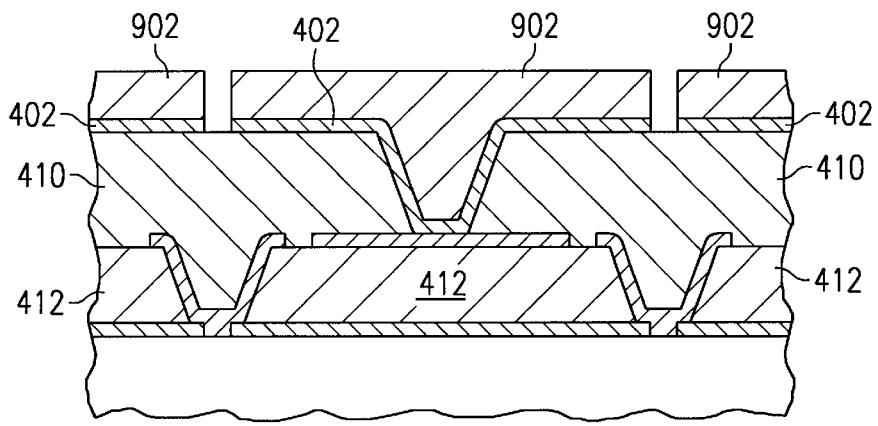
FIG. 11 is a cross section side view of the portion of a micromirror array of FIG. 10 after patterning the mirror metal layer according to one embodiment of the present invention.
Figure 12:
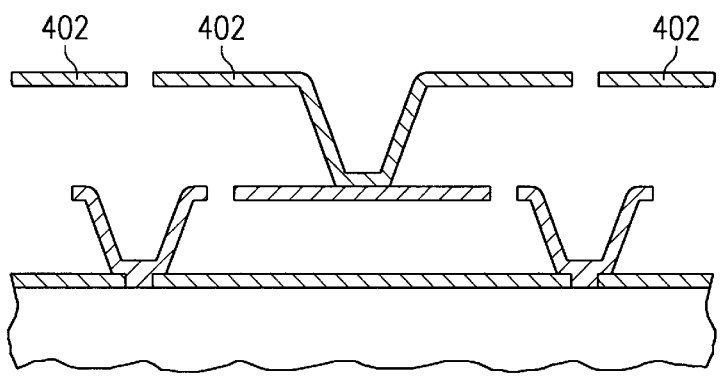
FIG. 12 is a cross section side view of the portion of a micromirror array of FIG. 10 after undercutting the mirrors according to one embodiment of the present invention.

The new process flow is illustrated in FIGS. 9 through 12. FIG. 9 is a block diagram showing the processing steps, and FIGS. 10 through 12 are cross section views of various stages of the mirror fabrication process. The mirror metal is sputter deposited in step 902 of FIG. 9. The wafer is then scrubbed with water in step 904. A photoresist layer is then spun on to the mirror metal layer in step 906. The photoresist is patterned and developed in step 908 to form openings to the metal layer. The openings define areas where the mirror metal layer will be removed. The patterned photoresist is inspected in step 910. FIG. 10 shows the patterned photoresist layer 902.

The mirror metal layer is etched in step 912 using the patterned photoresist layer as an etch mask. After the mirror metal has been etched, the webbing and other residues are removed in a clean up process 914 that uses photoresist developer as a solvent to remove the webbing. The developer clean up process enables a complete removal of the residue. FIG. 11 shows the etched mirror metal layer 402 and the remaining mirror pattern photo resist layer 902 after the developer clean up process.

The developer clean up process is uniquely advantageous for removing the webbing since it is able to do a thorough removal without damaging the remaining portions of the micromirror. For example, damage to the underlying spacer layer, known as trenching, can lead to mirror cupping and tilting of the mirrors. Spacer trenching can also lead to development of striations in the saw prep overcoat. As long as the saw prep overcoat is sufficiently thick the striations themselves are not device failures. Nevertheless, striations make it difficult to visually inspect the mirror underneath the saw prep coat.

The underlying spacer layer is not affected by the photoresist developer because the spacer layer has been cross-linked and deep UV hardened. The mirrors and mirror vias are susceptible to corrosion and pitting during the developer clean process. The photoresist mask, which is left on the mirror metal layer after the etch process is completed, protects the mirror metal layer from the developer chemicals.

Typical semiconductor processes clean the residue from the patterned metal step by stripping the residue and the remaining photoresist mask from the wafer. Typical semiconductor processes have much more leeway in the cleanup process since they need not protect either an underlying photoresist spacer layer or a photoresist etch mask. Nevertheless, the processes described herein may be used in the fabrication of integrated circuits as well as the fabrication of micromirrors and other MEMS, and may be used to pattern electrical interconnections on integrated circuits.

Although not used in the fabrication of micromirror arrays, the concepts of this invention may find application in forming complex metalization patterns on integrated circuits or micromechanical devices. Instead of using the process described herein to form mirrors, the mirror metal layer is patterned to form electrical interconnections or other structures. The photoresist etch mask remaining on the interconnections after the clean-up process is reflowed to fill the gaps between the underlying interconnections and to provide a planar surface on which to continue fabrication. The photo resist can be reflowed by heating the wafer. Another metal layer is then deposited and the process repeated. After the remaining interconnection layers are completed, the photoresist insulating spacer layers between the interconnections can be removed leaving insulating air gaps. These air gaps may then be filed using a suitable dielectric.

After the developer clean up process, the mirrors are inspected in step 916. This inspection verifies the proper gaps have been etched between the mirrors and verifies the removal of the mirror etch residue. A photoresist saw prep coating is then spun onto the wafer in step 918. The saw prep photoresist protects the mirrors from debris created during the saw process. Without the saw prep coating, the debris could easily scratch the mirrors. After sawing the wafer of micromirror device in step 920, also called dicing, the diced wafer is scrubbed in step 922. before the mirrors are undercut.

The undercut process of step 924 removes the photoresist spacer layers on which the hinge yoke and mirror have been fabricated. After the first and second photoresist spacer layers are removed, the mirrors are able to rotate about the torsion hinges. FIG. 12 shows a portion of the completed micromirror device.

Once the two spacer layers have been removed, the mirror is free to rotate about the axis formed by the torsion hinge. Returning to FIGS. 1 and 2, electrostatic attraction between an address electrode 110 and a deflectable rigid member, which in effect form the two plates of an air gap capacitor, is used to rotate the mirror structure. Depending on the design of the micromirror device, the deflectable rigid member is the torsion beam yoke 114, the beam or mirror 102, a beam attached directly to the torsion hinges, or a combination thereof. The upper address electrodes 124 also electrostatically attract the deflectable rigid member.

The force created by the voltage potential is a function of the reciprocal of the distance between the two plates. As the rigid member rotates due to the electrostatic torque, the torsion beam hinges resist deformation with a restoring torque which is an approximately linear function of the angular deflection of the torsion beams. The structure rotates until the restoring torsion beam torque equals the electrostatic torque or until the rotation is mechanically blocked by contact between the rotating structure and a fixed component. As discussed below, most micromirror devices are operated in a digital mode wherein sufficiently large bias voltages are used to ensure full deflection of the micromirror superstructure.

Micromirror devices are generally operated in one of two modes of operation. The first mode of operation is an analog mode, sometimes called beam steering, in which the address electrode is charged to a voltage corresponding to the desired deflection of the mirror. Light striking the micromirror device is reflected by the mirror at an angle determined by the deflection of the mirror. Depending on the voltage applied to the address electrode, the cone of light reflected by an individual mirror is directed to fall outside the aperture of a projection lens, partially within the aperture, or completely within the aperture of the lens. The reflected light is focused by the lens onto an image plane, with each individual mirror corresponding to a fixed location on the image plane. As the cone of reflected light is moved from completely within the aperture to completely outside the aperture, the image location corresponding to the mirror dims, creating continuous brightness levels.

The second mode of operation is a digital mode. When operated digitally, each micromirror is fully deflected in either of the two directions about the torsion beam axis. Digital operation uses a relatively large voltage to ensure the mirror is fully deflected. Since it is advantageous to drive the address electrode using standard logic voltage levels, a bias voltage, typically a negative voltage, is applied to the mirror metal layer to increase the voltage difference between the address electrodes and the mirrors. Use of a sufficiently large mirror bias voltage—a voltage above what is termed the collapse voltage of the device—ensures the mirror will deflect to the closest landing electrodes even in the absence of an address voltage. Therefore, by using a large mirror bias voltage, the address voltages need only be large enough to deflect the mirror slightly.

To create an image using the micromirror device, the light source is positioned at an angle equal to twice the angle of rotation so that mirrors rotated toward the light source reflect light in a direction normal to the surface of the micromirror device and into the aperture of a projection lens—creating a bright pixel on the image plane. Mirrors rotated away from the light source reflect light away from the projection lens—leaving the corresponding pixel dark. Intermediate brightness levels are created by pulse width modulation techniques in which the mirror is rapidly and repetitively rotated on and off. The duty cycle of the mirror determines the quantity of light reaching the image plane. The human eye integrates the light pulses and the brain perceives a flicker-free intermediate brightness level.

Full-color images are generated by using three micromirror devices to produce three single-color images, or by sequentially forming three single-color images using a single micromirror device illuminated by a beam of light passing through three color filters mounted on a rotating color wheel.

Figure 13:
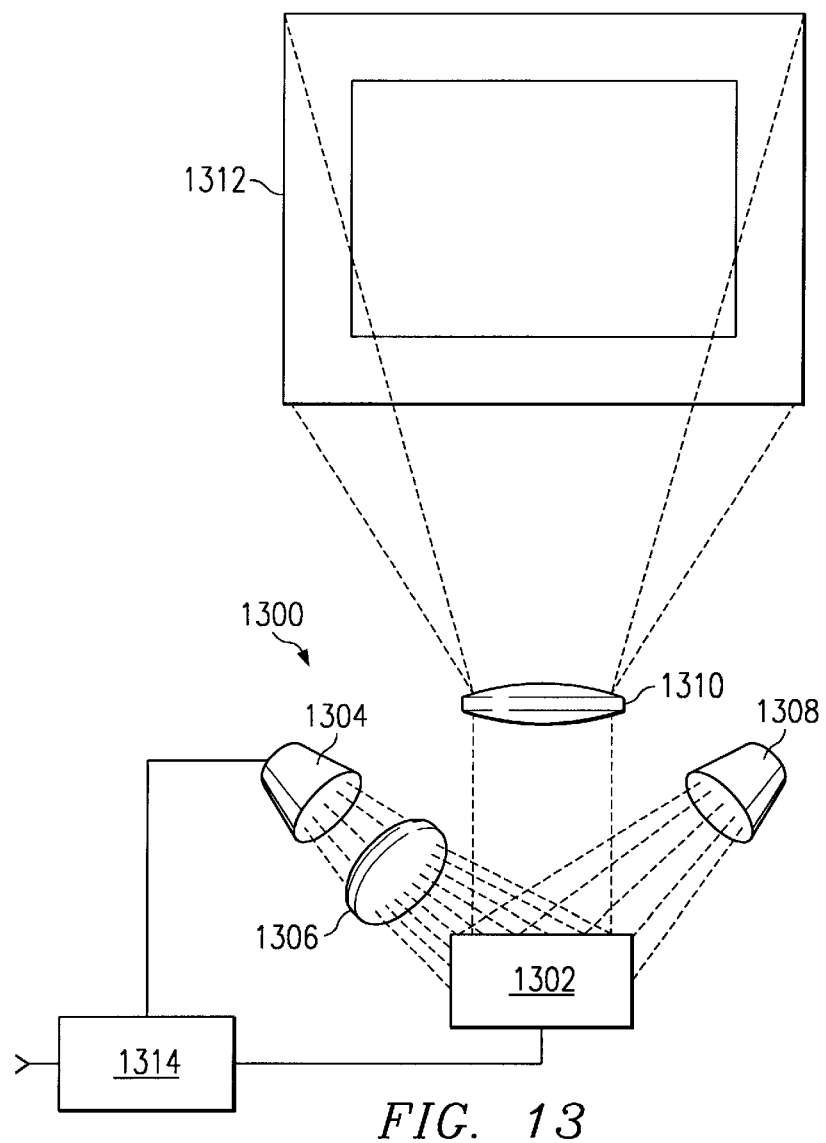
FIG. 13 is a schematic view of a micromirror-based projection system utilizing an improved micromirror device fabricated according to one embodiment of the present invention.

FIG. 13 is a schematic view of an image projection system 1300 using an improved micromirror 1302 according to the present invention. In FIG. 13, light from light source 1304 is focused on the improved micromirror 1302 by lens 1306. Although shown as a single lens, lens 1306 is typically a group of lenses and mirrors which together focus and direct light from the light source 1304 onto the surface of the micromirror device 1302. Image data and control signals from controller 1314 cause some mirrors to rotate to an on position and others to rotate to an off position. Mirrors on the micromirror device that are rotated to an off position reflect light to a light trap 1308 while mirrors rotated to an on position reflect light to projection lens 1310, which is shown as a single lens for simplicity. Projection lens 1310 focuses the light modulated by the micromirror device 1302 onto an image plane or screen 1312.

Thus, although there has been disclosed to this point a particular embodiment for a metal etch clean process, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims. In the following claims, only elements denoted by the words "means for" are intended to be interpreted as means plus function claims under 35 U.S.C. §112, paragraph six.

What is claimed is:

1. A method of fabricating a semiconductor device, the method comprising:
   depositing a first photoresist layer on a wafer of partially formed devices;
   depositing a metal layer over said first photoresist layer;
   depositing a second photoresist layer over said metal layer;
   patterning said second photoresist layer to expose regions of said metal layer;
   etching said metal layer to remove said exposed regions of said metal layer; and
   cleaning residue created by said etching using a photoresist developer, said first and second photoresist layers remaining after said cleaning.
2. The method of claim 1, comprising:
   deep UV hardening said first photoresist layer.
3. The method of claim 1, comprising:
   depositing said first photoresist layer by spinning-on said first photoresist layer.
4. The method of claim 1, comprising:
   patterning said first photoresist layer to create openings to an underlying layer.
5. The method of claim 1, said depositing a metal layer comprises depositing an aluminum layer.
6. The method of claim 1, said depositing a metal layer comprises sputtering said metal layer.
7. The method of claim 1, comprising:
   scrubbing said deposited metal layer.
8. The method of claim 1, comprising:
   inspecting said deposited metal layer.
9. The method of claim 1, said patterning said second photoresist layer defining mirrors on said metal layer.
10. The method of claim 1, comprising:
    depositing said first photoresist layer by spinning-on said photoresist layer.
11. The method of claim 1, comprising:
    depositing a photoresist coating over said second photoresist layer.
12. The method of claim 11, comprising:
    dicing said wafer.
13. A method of patterning a metal layer, the method comprising:
    depositing a metal layer on a wafer of partially formed devices;
    depositing a photoresist layer over said metal layer;
    patterning said photoresist layer to expose regions of said metal layer;
    etching said metal layer to remove said exposed regions of said metal layer; and
    cleaning residue created by said etching using a photoresist developer, said patterned photoresist layer remaining after said cleaning.
14. The method of claim 13, said depositing a metal layer comprises depositing an aluminum layer.
15. The method of claim 13, said depositing a metal layer comprises sputtering said metal layer.
16. The method of claim 13, comprising:
    scrubbing said deposited metal layer.
17. The method of claim 13, comprising:
    inspecting said deposited metal layer.
18. The method of claim 13, comprising:
    depositing said photoresist layer by spinning-on said photoresist layer.
19. The method of claim 13, comprising:
    patterning said photoresist layer to create openings to said metal layer.
20. The method of claim 13, said patterning said photoresist layer defines mirrors on said metal layer.
21. The method of claim 13, said patterning said photoresist layer defines electrical interconnections on said metal layer.
22. The method of claim 13, comprising:
    depositing a saw prep photoresist coating over said photoresist layer.
23. The method of claim 22, comprising:
    dicing said wafer.
24. The method of claim 13, comprising:
    heating said photoresist layer to reflow remaining portions of said photoresist layer.
25. The method of claim 24, comprising:
    depositing another metal layer over said reflowed photoresist layer.
26. The method of claim 25, comprising:
    patterning said another metal layer.
27. The method of claim 26, comprising:
    removing said reflowed photoresist layer.
28. The method of claim 27, comprising:
    depositing a saw prep photoresist coating over said patterned another metal layer.
29. The method of claim 28, comprising:
    dicing said wafer.
30. The method of claim 13, comprising:
    reflowing said photoresist layer.
31. The method of claim 30, comprising:
    depositing another metal layer over said reflowed photoresist layer.
32. The method of claim 31, comprising:
    patterning said another metal layer.
33. The method of claim 32, comprising:
    removing said reflowed photoresist layer.
34. The method of claim 33, comprising:
    depositing a saw prep photoresist coating over said photoresist layer.
35. The method of claim 34, comprising:
    dicing said wafer.

* * * * *